United States Patent
Suzuki et al.

(10) Patent No.: US 9,890,463 B2
(45) Date of Patent: Feb. 13, 2018

(54) ELECTROLYSIS COPPER-ALLOY FOIL, METHOD OF THE SAME, ELECTROLYTIC-SOLUTION USING THE PRODUCTION, NEGATIVE ELECTRODE AGGREGATION USED THE SAME, SECONDARY BATTERY, AND ELECTRODE OF THE SAME

(71) Applicant: Furukawa Electric Co., LTD., Tokyo (JP)

(72) Inventors: Akitoshi Suzuki, Tokyo (JP); Kensaku Shinozaki, Tokyo (JP); Kimiko Fujisawa, Tokyo (JP); Takahiro Tsuruta, Tokyo (JP); Takeshi Ezura, Tokyo (JP); Jun Shinozaki, Tokyo (JP); Masato Ebisugi, Tokyo (JP); Hirokazu Sasaki, Tokyo (JP); Satoshi Yamazaki, Tokyo (JP)

(73) Assignee: Furukawa Electric Co., LTD., Tokyo (JP)

( * ) Notice: Subject to any disclaimer, the term of this patent is extended or adjusted under 35 U.S.C. 154(b) by 384 days.

(21) Appl. No.: 13/965,291

(22) Filed: Aug. 13, 2013

(65) Prior Publication Data

US 2014/0045061 A1 Feb. 13, 2014

Related U.S. Application Data

(63) Continuation of application No. PCT/JP2012/069368, filed on Jul. 30, 2012.

(30) Foreign Application Priority Data

Jul. 29, 2011 (JP) .................................. 2011-166523
Oct. 31, 2011 (JP) .................................. 2011-238491

(Continued)

(51) Int. Cl.
  *H01M 4/04* (2006.01)
  *C25D 3/56* (2006.01)
  (Continued)

(52) U.S. Cl.
  CPC .................. *C25D 3/56* (2013.01); *C22C 1/02* (2013.01); *C22C 9/00* (2013.01); *C25D 1/04* (2013.01);
  (Continued)

(58) Field of Classification Search
  CPC ...................................................... H01M 4/04
  See application file for complete search history.

(56) References Cited

U.S. PATENT DOCUMENTS 6,440,503 B1  8/2002  Merdan et al.
6,497,806 B1  12/2002  Endo
(Continued)

FOREIGN PATENT DOCUMENTS

CN  1348326 A  5/2002
CN  1382310 A  11/2002
(Continued)

OTHER PUBLICATIONS

International Search Report dated Oct. 30, 2012 in PCT/JP2012/069368 filed Jul. 30, 2012.
(Continued)

*Primary Examiner* — Jacob Marks
(74) *Attorney, Agent, or Firm* — Oblon, McClelland, Maier & Neustadt, L.L.P.

(57) ABSTRACT

The invention relates to an electrolytic copper alloy foil having large mechanical strength in an ordinary state and showing resistant to heat deterioration even when it is heated to 300° C. or more. That electrolytic copper alloy foil, which contains tungsten copper, preferably incorporates tungsten into copper foil as a copper alloy, has a tensile strength at (Continued)

ordinary temperature of 650 MPa, has a tensile strength after heat treatment at 300° C. for 1 hour of 450 MPa or more, and has a conductivity of 80% or more. Further preferably, the electrolytic copper foil has an elongation at ordinary temperature of 2.5% or more and an elongation after treatment at 300° C. for 1 hour of 3.5% or more. The electrolytic copper foil is produced by adding a thiourea compound, tungsten salt, and chloride ions to a sulfuric acid-copper sulfate electrolyte and performing electrolytic deposition.

8 Claims, 1 Drawing Sheet

(30) Foreign Application Priority Data

| Mar. 9, 2012 | (JP) | ................................ 2012-052765 |
|---|---|---|
| Mar. 28, 2012 | (JP) | ................................ 2012-074173 |

(51) Int. Cl.

| *C25D 3/58* | (2006.01) |
|---|---|
| *C25D 7/06* | (2006.01) |
| *H01M 4/66* | (2006.01) |
| *C22C 9/00* | (2006.01) |
| *C25D 1/04* | (2006.01) |
| *C22C 1/02* | (2006.01) |
| *H01M 4/134* | (2010.01) |
| *H01M 10/052* | (2010.01) |
| *H05K 3/02* | (2006.01) |

(52) U.S. Cl.
CPC ............. *C25D 3/58* (2013.01); *C25D 7/0614* (2013.01); *H01M 4/662* (2013.01); *H01M 4/134* (2013.01); *H01M 10/052* (2013.01); *H05K 3/022* (2013.01)

(56) References Cited

U.S. PATENT DOCUMENTS

| 6,527,939 | B1 | 3/2003 | Hardee et al. |
|---|---|---|---|
| 6,685,804 | B1 | 2/2004 | Ikeda et al. |
| 6,887,511 | B1 | 5/2005 | Shima et al. |
| 6,984,453 | B2 | 1/2006 | Sugimoto et al. |
| 7,192,673 | B1 | 3/2007 | Ikeda et al. |
| 7,195,842 | B1 | 3/2007 | Fujimoto et al. |
| 7,235,330 | B1 | 6/2007 | Fujimoto et al. |
| 7,241,533 | B1 | 7/2007 | Ikeda et al. |
| 7,381,475 | B2 | 6/2008 | Suzuki |
| 7,410,728 | B1 | 8/2008 | Fujimoto et al. |
| 7,794,881 | B1 | 9/2010 | Fujimoto et al. |
| 2001/0014408 | A1 | 8/2001 | Mitsuhashi et al. |
| 2002/0053517 | A1 | 5/2002 | Endo et al. |
| 2002/0177044 | A1* | 11/2002 | Yagi ........................ H01M 4/13 429/231.95 |
| 2002/0182344 | A1 | 12/2002 | Merdan et al. |
| 2004/0104117 | A1 | 6/2004 | Yang et al. |
| 2004/0154930 | A1 | 8/2004 | Shinozaki |
| 2004/0157080 | A1 | 8/2004 | Shinozaki |
| 2004/0157121 | A1* | 8/2004 | Watanabe et al. ............ 429/185 |
| 2010/0330427 | A1* | 12/2010 | Kogetsu ................. H01M 2/22 429/220 |
| 2011/0193967 | A1 | 8/2011 | Matsumoto et al. |
| 2014/0291156 | A1 | 10/2014 | Ezura et al. |

FOREIGN PATENT DOCUMENTS

| CN | 1530469 A | 9/2004 |
|---|---|---|
| CN | 1657279 A | 8/2005 |
| EP | 1 448 036 A1 | 8/2004 |
| JP | 3263430 | * 4/1992 |
| JP | 7-278867 A | 10/1995 |
| JP | 9-67693 | 3/1997 |
| JP | 3238278 | 10/2001 |
| JP | 3270637 | 1/2002 |
| JP | 2007-294923 | 11/2007 |
| JP | 4120806 | 5/2008 |
| JP | 2008-248325 A | 10/2008 |
| JP | 4273309 | 3/2009 |
| JP | 2009-221592 | 10/2009 |
| JP | 2011-166523 A | 8/2011 |
| JP | 2011-238491 A | 11/2011 |
| JP | 2012-052765 A | 3/2012 |
| JP | 2012-074173 A | 4/2012 |
| JP | 2012-241022 A | 12/2012 |
| JP | 2013-506025 | 2/2013 |
| KR | 10-2001-0108414 | 12/2001 |
| TW | 499508 | 8/2002 |
| TW | 200302036 A | 7/2003 |
| TW | 200407465 A | 5/2004 |
| WO | WO 2013/018773 A1 | 2/2013 |

OTHER PUBLICATIONS

Office Action dated Jan. 28, 2015 in Korean Patent Application No. 10-2013-7006252 (with English language translation).
Office Action dated Apr. 16, 2013 in Japanese Patent Application No. 2012-249946 (English translation only).
Office Action dated Oct. 21, 2014 in Taiwanese Patent Application No. 101127554 (English translation only).
Office Action dated Feb. 28, 2015 in Chinese Patent Application No. 201280004436.7 (English translation only).
Search Report dated Jul. 6, 2015 in European Patent Application No. 12819841.3.
Office Action dated Sep. 22, 2015 in Korean Patent Application No. 10-2013-7006252 (English abstract only).
Office Action dated Nov. 4, 2015 in Chinese Patent Application No. 201280004436.7.
Chin an Huang et al., "Electrocrystallization Behavior of Copper Electrodeposited from Aqueous Sulfuric Acid with Thiourea and Chloride Additives", ECS Transactions, vol. 2, May 7, 2006, XP055196699, pp. 329-334.

* cited by examiner

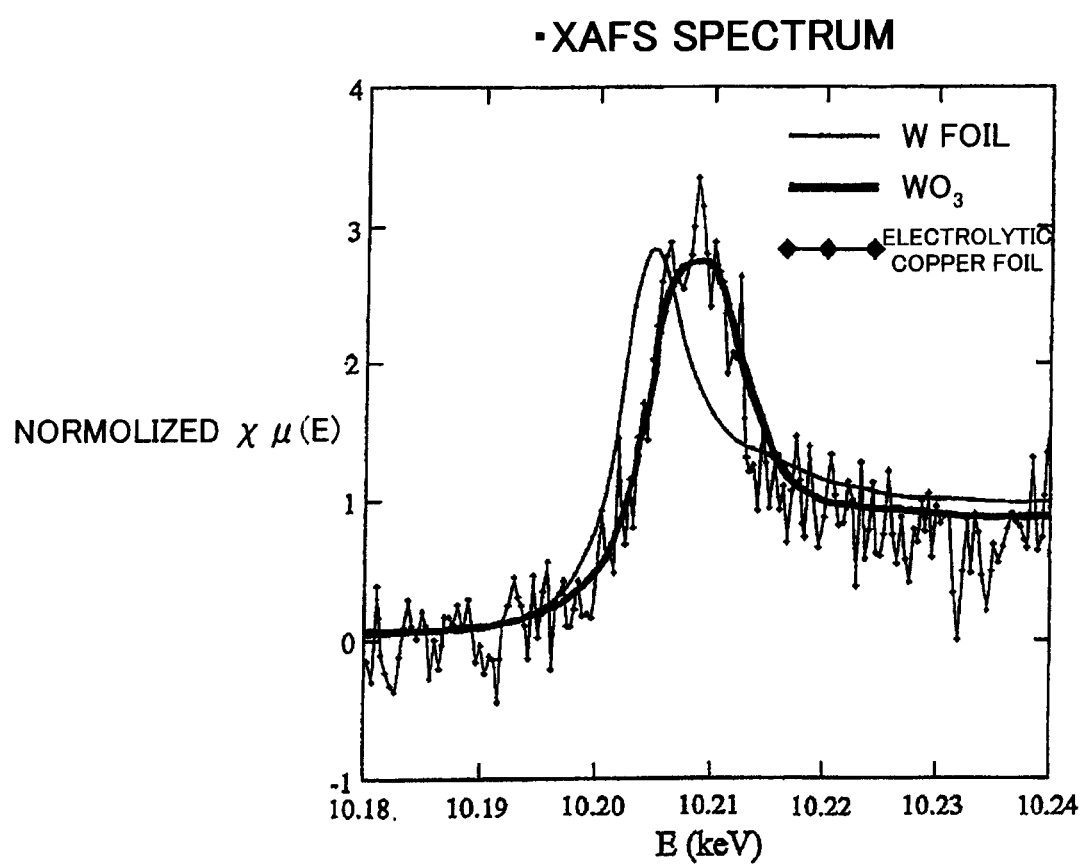

ELECTROLYSIS COPPER-ALLOY FOIL, METHOD OF THE SAME, ELECTROLYTIC-SOLUTION USING THE PRODUCTION, NEGATIVE ELECTRODE AGGREGATION USED THE SAME, SECONDARY BATTERY, AND ELECTRODE OF THE SAME

TECHNICAL FIELD

The present invention relates to an electrolytic copper alloy foil which has an electrolytic deposition surface with a low profile and provides a large mechanical strength and which is resistant to change in mechanical strength even if heated at a high temperature, and to a method of production of the same.

Further, the present invention relates to an electrolytic copper alloy foil forming-use electrolyte for forming the electrolytic copper alloy foil.

Note that, here, the "mechanical strength" indicates the tensile strength, 0.2% yield strength, and so on.

The present invention further relates to a rigid printed circuit board which uses the electrolytic copper alloy foil as a conductive material, a flexible printed circuit board, an electromagnetic wave shield material, and so on.

Further, the present invention relates to a secondary cell which uses the electrolytic copper alloy foil as a secondary cell-use current collector, deposits an active material on the current collector to form a secondary cell-use electrode, and includes the electrode.

BACKGROUND ART

A copper foil is used in a rigid printed circuit board, a flexible printed circuit board, an electromagnetic wave shield material, acurrent collector of a cell, and other various fields.

Among these fields, in the field of printed circuit boards (flexible circuit boards, hereinafter referred to as "FPCs") which are bonded to a polyimide film, in hard disk (hereinafter, referred to as "HDD") suspension materials or tape automated bonding (hereinafter, referred to as "TAB") materials, improvement of the strength of the copper foil has been requested.

The suspensions which are mounted on HDDs have mostly changed from the conventionally used wire type suspensions to the wiring-integrated type suspensions in which buoyancy and positional accuracy of the flying head to the storage medium of the disk are stable along with the increase of the capacity of HDDs.

This wiring-integrated type suspension includes the following three types.
a. A so-called FSA (flex suspension aggregation) type obtained by working a flexible printed board and using a binder for bonding
b. A so-called CIS (circuit integrated suspension) type obtained by shaping a precursor of a polyimide resin, amic acid, then imidizing it and further plating the polyimide to thereby form wiring.
c. A so-called TSA (trace suspension aggregation) type obtained by etching a laminate comprised of stainless steel foil, polyimide resin, and copper foil to thereby work it to a predetermined shape A TSA suspension enables easy formation of a flying lead by laminating a copper alloy foil having a high strength and has a high degree of freedom in shaping, is relatively cheap, and is good in dimensional precision, so is being widely used.

A laminate formed according to the TSA method is produced by using as materials a stainless steel foil of a thickness of about 12 to 30 µm, a polyimide layer of a thickness of about 5 to 20 µm, and a copper alloy foil of a thickness of about 7 to 14 µm.

In the production of the laminate, first, a polyimide resin solution is coated on the base member of stainless steel foil. After coating, the solvent is removed by preheating, then heat treatment is further carried out for imidization. Then, the copper alloy foil is superimposed on the imidized polyimide resin layer and the aggregation is hot pressed at a temperature of about 300° C. for lamination to thereby produce a laminate comprised of a stainless steel layer, polyimide layer, and copper alloy layer.

At the time of this heating at about 300° C., the stainless steel foil does not exhibit almost any dimensional change. However, if using a conventional electrolytic copper foil, the electrolytic copper foil is annealed at a temperature of about 300° C., increasingly recrystallizes, and softens, so changes in dimensions. For this reason, the laminate warps after lamination, so the precision of dimensions of the product is lowered.

In order not to cause warping in the laminate after lamination, provision of a copper alloy foil in which the dimensional change at the time of heating is as small as possible has been desired.

Further, in a TAB material, in the same way as the HDD suspension material, raising of the strength of the copper foil and lowering of the roughness of the foil surface have been demanded.

In a TAB product, a plurality of terminals of an IC chip are directly bonded to inner leads (flying leads) arranged in a device hole located at the substantial center of the product. This bonding is carried out by using a bonding system for instantaneous electrical heating and application of a constant bonding pressure. At this time, it suffers from the disadvantage that the inner leads obtained by etching of the electrolytic copper foil are pulled and stretched by the bonding pressure.

Further, if the strength of the electrolytic copper foil is low, it plastically deforms to cause slack in the inner leads. In remarkable cases, there is a possibility of breakage.

Accordingly, in order to make the line width of the inner leads finer, it is demanded that the electrolytic copper foil which is used have a roughened surface which is roughened to a low degree and have a high strength.

In this case as well, it is necessary that the copper foil have a high strength in an ordinary state (ordinary temperature/ordinary pressure state) and have a high strength even after heating. When it is used for TAB, there is used an FPC comprised of two layers or three layers formed by bonding copper foils and polyimide to each other. In a three-layer FPC, when bonding polyimide to the copper foils, an epoxy binder is used and the members are bonded to each other at a temperature of around 180° C. Further, in a two-layer FPC using a polyimide binder, bonding is carried out at a temperature of around 300° C.

Even if the electrolytic copper foil has a large mechanical strength in the ordinary state, there is no meaning if the electrolytic copper foil is softened when bonded to polyimide. The conventional high strength electrolytic copper foil has a large mechanical strength in the ordinary state and does not change much at all in mechanical strength even when it is heated at approximately 180° C. However, when it is heated at about 300° C., it is annealed and increasingly recrystallizes, therefore it is rapidly softened and falls in mechanical strength. Such copper foil is unsuitable for the purpose of TAB.

Further, copper foil is used as a current collector for use for a cell such as a lithium ion secondary cell. A lithium ion secondary cell is basically configured by a positive electrode, a negative electrode, and an electrolyte. The negative electrode is formed by coating a negative active material layer on the surface of the copper foil used as the current collector.

The method of formation of the negative electrode generally carries out by: the method of dissolving a negative active material and binder resin (added for the purpose of binding the active material and copper foil substrate) in a solvent to form a slurry, coating this on the copper foil substrate, drying it at a temperature not less than a curing temperature of the binder resin, and then pressing.

As the binder resin, polyvinylidene fluoride (PVDF), styrene butadiene rubber, and so on are widely used.

Active materials comprised of high theoretical capacity silicon-, tin-, or germanium alloy-based materials and the like have come into focus along with the increase of cell capacity in recent years. These have very large rates of expansion of volume along with insertion/desorption of lithium at the time of charging/discharging. The above-mentioned binder resins are insufficient in strength. Therefore, a polyimide resin, which has a high bonding strength with a copper substrate, has been preferably used. However, a polyimide resin has a very high curing temperature such as about 300° C. unlike the binder resin explained above, therefore a negative current collector (copper foil) durable against this heating condition has been demanded.

In this way, in both of the FPC field and secondary cell field, a polyimide resin having a very high curing temperature such as about 300° C. has begun to be used as the binder, therefore a copper foil durable against this heating condition has been demanded.

On the other hand, to obtain electrolytic copper foil which has a surface to be bonded to the polyimide resin base material with a low profile and which is excellent in mechanical strength as well, various studies such as shown below have been carried out.

For example, Patent Literature (PLT) 1, Japanese Patent No. 4120806, discloses, as a copper foil which is optimal for use for a printed circuit board and use for a negative electrode current collector for secondary cell use, a low roughened surface electrolytic copper foil which has a roughened surface which has a surface roughness Rz of 2.0 μm or less and is uniformly roughened to a low degree and which has an elongation at 180° C. of 10.0% or more.

Further, PLT 1 discloses that the above electrolytic copper foil can be obtained by using an sulfuric acid-copper sulfate aqueous solution as the electrolyte and adding polyethylene imine or its derivative, a sulfonate of active organic sulfur, and chlorine ions.

PLT 2, Japanese Patent No. 4273309, discloses an electrolytic copper foil in which the surface roughness Rz is 2.5 μm or less, the tensile strength at 25° C. measured within 20 minutes from the point of time of completion of electrodeposition is 820 MPa or more, and a rate of fall of the tensile strength at 25° C. measured when 300 minutes have passed from the point of completion of electrodeposition with respect to the tensile strength at 25° C. measured within 25 minutes from the point of completion of electrodeposition is 10% or less.

Further, PLT 2 discloses that the above electrolytic copper foil can be obtained by using an aqueous solution containing copper sulfate and sulfuric acid as the electrolyte and adding hydroxyethyl cellulose, polyethylene imine, a sulfonate of an active organic sulfur compound, acetylene glycol, and chlorine ions.

PLT 3, Japanese Patent No. 3270637, discloses a controlled, low profile electrolytic copper foil comprised of an electrolytic copper foil having a particle structure free from columnar crystals and twin boundaries and having a mean particle size of up to 10 μm wherein the particle structure is a particle structure which is substantially uniform and randomly oriented.

In this electrolytic copper foil, the maximum tensile strength at 23° C. is within a range of 87,000 to 120,000 psi (600 MPa to 827 MPa) and the ultimate elongation at 180° C. is 25,000 to 35,000 psi (172 MPa to 241 MPa).

In the case of the electrolytic copper foils disclosed in the above PLTs 1 to 3, the mechanical strength in the ordinary state is large in all instances, but the mechanical strength remarkably falls in a case where they are heated at a high temperature of 300° C. or more.

In the case of the electrolytic copper foils disclosed in the above PLTs 1 to 3, all use an electrolyte containing copper sulfate and sulfuric acid and all use organic compounds as additives though the types of additives are different (hereinafter referred to as "organic additives").

Many organic additives usually have the effect of suppressing crystal growth. It is considered that the crystals are incorporated into the grain boundaries.

In this case, the larger the amount of the organic additive incorporated into the grain boundaries, the more improved the mechanical strength tends to become that disclosed in Non-Patent Literature (NPLT) 1: Shoji Shiga, Metal Surface Technology, Vol. 31, No. 10, p. 573 (1980)).

When the organic additive which has been incorporated into the grain boundaries is heated at a high temperature of 300° C. or more, the organic additive decomposes. As a result, it is considered that the mechanical strength is lowered.

On the other hand, as copper foil satisfying the above demands, use is made of rolled copper alloy foil. Rolled copper alloy foil is not annealed much at a temperature of about 300° C., has a small dimensional change at the time of heating, and has a small change of mechanical strength as well.

However, rolled copper foil is expensive compared with electrolytic copper foil, and it is difficult to satisfy demands on width, thickness, etc. with it.

Therefore, to obtain electrolytic copper foil which has a surface to be bonded to the polyimide resin base material with a low profile and which is excellent in mechanical strength as well, the present inventors attempted to develop an electrolytic copper alloy foil which is improved in the heat resistance of the copper foil by adding tungsten to the copper foil and is suitable for applications which use a polyimide resin as a binder resin.

However, tungsten is a metal which is very hard to incorporate into electrolytic copper foil.

PLT 4 (Japanese Patent No. 3238278) and PLT 5 (Japanese Patent Publication No. 9-67693 A1) disclose addition of tungsten to the electrolyte for forming the electrolytic copper foil.

PLTs 4 and 5 relate to copper foil for a printed circuit and disclose in their examples to form foil by an electrolyte obtained by adding 20 to 100 mg/liter of tungsten (W) and chlorine ions (chloride ions) to the electrolyte and that the formed copper foil does not have pinholes, is excellent in adhesion with the resin substrate, and has a high hot-rolling elongation at 180° C. However, there is no description that tungsten was incorporated into the copper foil, that is, that a Cu—W alloy foil was produced.

In this regard, an electrolyte containing copper sulfate and sulfuric acid is used as the electrolyte of the electrolytic copper foil. Various additives are added to the plating bath for the purpose of glossing and smoothing the copper foil surface, reducing stress of the copper foil, and so on. When no additives are used, the surface morphology, mechanical properties, etc. demanded from the copper foil are not obtained, therefore the importance of additives is very high. In particular, a copper sulfate plating bath is a simple acidic solution, therefore has a poor uniform electrodeposition property, so production of a preferred electrolytic copper foil without any additives is difficult. As additives used in the copper sulfate plating bath, chlorine ions, polyoxyethylene-based surfactants, smoothening agents, organic sulfates, or another gloss agents, glue, gelatin, etc. are proposed and used.

Unless chlorine or other additives are added to the copper sulfate plating bath, plating is concentrated at high current portions in which electricity easily flows (portions near anode, end of cathode, tip ends of pointed objects, etc.) and a generally called "burning state (where the plating surface becomes more uneven)" occurs. For this reason, about 20 to 100 mg/liter of chlorine ions are added in the usual copper sulfate plating. When the chlorine ions become less than 20 mg/liter, for the above reason, burning easily occurs. Conversely, when it exceeds 80 mg/liter, the leveling action is too strong, therefore "dull deposition" occurs in low current portions (in small holes etc.).

However, when there are chlorine ions in the electrolyte, it becomes difficult to mix a specific metal into the copper foil to change the characteristics of the copper foil. That is, with an electrolyte free from chlorine ions, it is possible to mix another metal into the copper foil. The characteristics of the copper foil can be changed by mixing (alloying) another metal, but it becomes hard to mix another metal into the copper foil if chlorine ions enter the electrolyte, and it becomes extremely difficult to change the characteristics of the copper foil by another metal.

For example, PLTs 4 and 5 disclose a method of producing an electrolytic copper foil by an electrolyte obtained by adding tungsten into a sulfuric acid-copper sulfate electrolyte and further adding glue and chlorine ions and describe, as the effect thereof, that the production of copper foil having a hot-rolling elongation at 180° C. of 3% or more and a large surface roughness, but with few pinholes is possible.

Therefore, the present inventors repeated the experiment of adding tungsten into the sulfuric acid-copper sulfate electrolyte and further adding glue and chlorine ions and could produce copper foil with the characteristics aimed at by the electrolytic copper foil disclosed in PLT 4 of a hot-rolling elongation at 180° C. of 3% or more, a large roughness of the roughened surface, and few pinholes. However, when heat treating this copper foil at 300° C. for 1 hour, it was learned that the mechanical strength could not be kept. As a result of analysis of this copper foil, it was clarified that tungsten did not form eutectoids in the electrically deposited copper.

That is, in the method of PLTs 4 and 5, the electrodeposition was carried out by an electrolyte obtained by adding tungsten to a sulfuric acid-copper sulfate electrolyte and further adding 10 mg/liter or less of glue and 20 to 100 mg/liter of chlorine ions. Therefore, an electrolytic copper alloy foil in which eutectoids of tungsten did not form in the copper foil and in which a high mechanical strength was kept even if it was heated at 300° C. could not be produced.

CITATIONS LIST

Patent Literature (PLT)

PLT1: Japanese Patent No. 4120806
PLT2: Japanese Patent No. 4273309
PLT3: Japanese Patent No. 3270637
PLT4: Japanese Patent No. 3238278
PLT5: Japanese Patent Publication No. 9-67693 A1
PLT6: Japanese Patent No. 3238278
PLT7: Japanese Patent Publication No. 9-67693 A1

Non-Patent Literature (NPLT)

NPLT 1: Shoji Shiga, Metal Surface Technology, Vol. 31, No. 10, p. 573 (1980)

SUMMARY OF INVENTION

Technical Problem

The present inventors overcame the problems explained above and, by incorporating tungsten into the copper alloy in the copper foil, succeeded in forming an electrolytic copper alloy foil with a tensile strength at ordinary temperature of 650 MPa or more, a tensile strength after heat treatment at 300° C. for 1 hour of 450 MPa or more, and a conductivity of 80% or more.

Further, the present inventors enabled use of a polyimide binder for example for a HDD suspension material and TAB material or for an active material of an Si or Sn alloy active material which repeatedly greatly expands and contracts and succeeded in developing as a conductor (copper foil) an electrolytic copper alloy foil which will not deform or break.

An object of the present invention is to provide an electrolytic copper alloy foil having a tensile strength at ordinary temperature of 650 MPa or more, a tensile strength after heat treatment at 300° C. for 1 hour of 450 MPa or more, and a conductivity of 80% or more.

Further, another object of the present invention is to provide an electrolytic copper alloy foil excellent in mechanical strength in applications in the field of printed circuit boards bonded to polyimide film.

Further, still another object of the present invention is to provide a copper alloy foil in a lithium ion secondary cell using an Si or Sn alloy active material in which an adhesion between the collector (copper foil) and the active material is maintained by the polyimide binder even against large expansion and contraction of the Si or Sn alloy active material and in which the current collector (copper foil) will not deform or break.

Solution to Problem

An electrolytic copper alloy foil of the present invention is an electrolytic copper alloy foil containing tungsten.

Preferably all or a portion of the tungsten is incorporated as an oxide.

Further, according to the present invention, there is provided an electrolytic copper alloy foil containing tungsten and has a remainder (balance) substantially comprised of copper. Note that, the above "remainder (balance) is substantially comprised of copper" means that the copper contains unavoidable impurities or contains a small amount of additives.

Preferably, it is an electrolytic copper alloy foil in which a peak intensity ratio I<220>/I<200> obtained by X-ray diffraction between the peak intensity I<220> of the crystal orientation <220> and the peak intensity I<200> of the crystal orientation <200> is 1.2 or more.

Further preferably, the electrolytic copper alloy foil contains 0.0001 to 0.060 wt % or tungsten.

Further, according to the present invention, there is provided an electrolytic copper alloy foil containing 0.001 to 0.055 wt % of tungsten, having a tensile strength at ordinary temperature of 650 MPa or more, and having a tensile strength after treatment at 300° C. for 1 hour of 450 MPa or more.

Further, according to the present invention, there is provided an electrolytic copper alloy foil containing 0.001 to 0.055 wt % of tungsten, having a tensile strength at ordinary temperature of 650 MPa or more, having a tensile strength after treatment at 300° C. for 1 hour of 450 MPa or more, and having a conductivity of 80% or more.

Preferably it further contains chlorine ions.

Further preferably, the content of the chlorine is 0.005 to 0.040 wt %.

Preferably the electrolytic copper alloy foil has an elongation at ordinary temperature of 2.5% or more and an elongation after treatment at 300° C. for 1 hour of 3.5% or more.

According to the present invention, there is provided a negative electrode current collector used for secondary cell which uses the electrolytic copper alloy foil disclosed in any of above.

Further, according to the present invention, there is provided an electrode for secondary cell use in which an electrolytic copper alloy foil disclosed in any of the above is used as a negative electrode current collector for a secondary cell and in which an active material containing as a principal ingredient silicon, germanium, tin, or alloyed compound of the same is deposited on the surface.

According to the present invention, there is provided a secondary cell using the above electrode for secondary cell use.

According to the present invention, there is provided a method of production of an electrolytic copper alloy foil used for producing an electrolytic copper alloy foil containing tungsten and has a remainder (balance) comprised of copper, comprising the steps of adding a thiourea compound, tungsten salt, and chlorine ions to a sulfuric acid-copper sulfate electrolyte as additives, and performing electrolytic deposition.

Further, according to the present invention, there is provided a method of production of a copper alloy foil containing 0.001 to 0.055 wt % of tungsten, having a tensile strength at ordinary temperature of 650 MPa or more, having a tensile strength after treatment at 300° C. for 1 hour of 450 MPa or more, and having a conductivity of 80% or more, wherein the copper alloy foil is formed by a copper sulfate electrolyte obtained by adding, as additives, 10 to 1,000 ppm of tungsten, 1 to 20 ppm of at thiourea compound, and 1 to 100 ppm of chlorine ions to the copper sulfate electrolyte.

According to the present invention, there is provided an electrolyte for forming an electrolytic copper foil containing copper sulfate, sulfuric acid, and chlorine ions and having tungsten or a tungsten compound and thiourea organic additive added to it.

Preferably, the electrolyte has 10 to 1,000 ppm of tungsten or a tungsten compound as tungsten, 1 to 20 ppm of a thiourea compound, and 1 to 100 ppm of chlorine ions added to it.

Further preferably, the thiourea compound added to the electrolyte is any of thiourea, N,N-diethylthiourea, tetramethylthiourea, and ethylene thiourea.

Further preferably, the electrolyte has at least one of ammonia ions and nitrate ions added to it.

According to the present invention, there is provided an electrolytic copper alloy foil which is electrolytically formed by using the electrolyte for forming electrolytic copper alloy foil described above.

Advantageous Effects of Invention

According to the present invention, an electrolytic copper alloy foil having a large mechanical strength in an ordinary state and resistant to heat deterioration even by heating at 300° C. or more can be provided.

BRIEF DESCRIPTION OF DRAWINGS

FIG. 1 is an XAFS spectrum diagram of an electrolytic copper alloy foil of the present invention.

DESCRIPTION OF EMBODIMENTS

An electrolytic copper alloy foil of the present invention is an electrolytic copper alloy foil (Cu—W alloy foil) containing tungsten and having a remainder (balance) comprised of copper.

The amount of tungsten contained in the electrolytic copper alloy foil is preferably within a range from 0.0001 to 0.060 wt %.

The reason for why the content of tungsten is preferably controlled to 0.0001 wt % or more is that there is almost no effect of addition of tungsten if the content is less than 0.0001 wt %. On the other hand, the reason for making the amount of addition of tungsten preferably 0.060 wt % or less is that the effect is already saturated even when it is added over 0.060 wt % and no effect of improvement of physical properties is seen.

That is, the copper alloy foil obtained by adding tungsten in an amount less than 0.0001 wt % tends to fall in mechanical strength after heating at 300° C. for 1 hour in the same way as the case where tungsten is not contained.

The larger the amount of addition of tungsten, the smaller the drop of the strength after heating at 300° C. for 1 hour. However, when the content becomes larger to a certain extent, the effect is saturated. Accordingly, the upper limit of the amount of addition is about 0.060 wt %.

The inventors of the present invention repeated various experiments in order to produce a Cu—W alloy foil. As a result, in an electrolyte containing chlorine ions, tungsten was not incorporated into the formed copper foil even when a large amount of tungsten was added into the solution. Naturally. the mechanical strength of the copper foil formed by such an electrolyte at ordinary temperature and after heating was not improved.

However, the inventors discovered that even if chlorine ions are added to the electrolyte, if a thiourea compound is added to the solution, according to the foil formation conditions, tungsten is incorporated into the foil.

When analyzing the factors of incorporation of tungsten into the copper foil based on such a discovery, the following result was obtained: the tungsten is incorporated into the copper foil if the ratio between the peak intensity I<220> in the crystal orientation <220> and the peak intensity I<200> in the crystal orientation <200> which is obtained by the X-ray diffraction of the copper foil, that is, the peak intensity ratio I<220>/I<200>, is 1.2 or more.

By forming the electrolytic copper alloy foil under the following conditions based on such a discovery, the inventors succeeded in the production of an electrolytic copper alloy foil excellent in heat resistance.

That is, by forming a copper alloy foil having a tensile strength after heating at 300° C. for 1 hour of 450 MPa or more by the following basic electrolytic bath composition and electrolytic conditions, an electrolytic copper alloy foil in which the peak intensity ratio obtained by the X-ray diffraction of the electrolytic copper alloy foil, i.e., I<220>/I<200>, becomes 1.2 or more and in which tungsten is incorporated as a Cu—W alloy into the foil can be produced.

Basic Electrolytic Bath Composition:
Cu=50 to 150 g/liter
$H_2SO_4$=20 to 200 g/liter
Cl=1 to 100 ppm
Sodium tungstate (as tungsten)=10 to 1,000 ppm
Thiourea compound=3 to 20 ppm
Electrolytic Conditions:
Current density=30 to 100 A/dm$^2$
Solution temperature=30 to 70° C.

The additives added to the sulfuric acid-copper sulfate electrolyte are as follows.
Additive A: Thiourea compound
Additive B: Tungsten salt
Additive C: Chlorine ions
Additive A: A thiourea compound is an organic compound having the following structure.

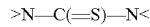

>N—C(=S)—N<

Examples of thiourea compounds are thiourea, N,N-diethylthiourea, tetramethylthiourea, and ethylene thiourea. However, these only exemplify ones used in the examples which will be explained later. Any compound is useable so far as the compound has the structural characteristics as explained above and exhibits the same effects.

Additive B: A tungsten salt is dissolved in the electrolyte containing copper sulfate and sulfuric acid. There can be mentioned sodium tungstate, ammonium tungstate, potassium tungstate, etc.

Additive C: The additive of chlorine ions is selected from among compounds which dissolve in an electrolyte containing copper sulfate and sulfuric acid. There can be mentioned hydrochloric acid, sodium chloride, potassium chloride, and so on.

The reason for use of a thiourea compound as an organic additive is that these compounds easily change to the structure of [=S] in the solution. The [=S] structure is adsorbed at the copper with a high priority to form an adsorbed layer of organic molecules. By adsorption of tungsten oxide onto the adsorbed layer, tungsten is incorporated into the foil together with the thiourea compound.

The tungsten exists as an oxide in an acidic solution. However, by electrodeposition of copper using an electrolyte containing chlorine, the copper-precipitated surface is coated by the chlorine ions, therefore the tungsten oxide is not adsorbed to the copper, so incorporation of tungsten into the foil does not occur. When a thiourea compound is added to the electrolyte, the [=S] structure is adsorbed onto the copper with a higher priority than the chlorine ions, and an adsorbed layer of organic molecules is formed on the copper. It is believed that tungsten is incorporated into the foil together with the thiourea compound by adsorption of the tungsten oxide onto the adsorbed layer.

In this way, the electrolytic copper alloy foil of the present invention is formed from an electrolyte containing tungsten, a thiourea compound, and chlorine in a sulfuric acid-copper sulfate electrolyte by electrolytic deposition. It is considered that, if electrolytically depositing copper in this sulfuric acid-copper sulfate electrolyte containing tungsten, a thiourea compound, and chlorine, the tungsten oxide is adsorbed at the grain boundaries of the copper together with the thiourea compound, the growth of crystal nuclei is suppressed, and refinement of crystal grains is caused (lowering of profile), and an electrolytic copper alloy foil provided with a large mechanical strength in an ordinary state is formed.

Further, the inventors of the present invention repeated various experiments for producing Cu—W alloy foil. As a result, with an electrolyte containing chlorine ions, even when a large amount of tungsten was added into the solution, incorporation of tungsten into the electrolytic copper foil did not occur. Further, as disclosed in PLTs 4 and 5, even when tungsten and glue were added to the electrolyte containing chlorine ions, incorporation of tungsten into the electrolytic copper foil did not occur.

Naturally, the electrolytic copper foil formed by such an electrolyte was greatly lowered in mechanical strength after heating at a high temperature of about 300° C.

However, the inventors discovered that if a thiourea compound is added to the electrolyte, even if chlorine ions are contained, according to the foil formation conditions, tungsten is incorporated into the foil.

When analyzing the factors of incorporation of tungsten into copper foil based on such discovery, result as obtained that incorporation of tungsten was promoted if the peak intensity ratio obtained by the X-ray diffraction of the copper foil, i.e., I<220>/I<200>, was 1.2 or more.

It is considered that the tungsten oxide at the grain boundaries of this copper alloy foil remains at the grain boundaries as tungsten oxide as it is without bonding with or being absorbed at the bulk copper crystal.

Accordingly, it is considered that, even if electrolytic copper alloy foil containing tungsten is heated at a high temperature of about 300° C., the tungsten oxide remains at the grain boundaries and acts to prevent fine crystals of the copper from recrystallization and the crystals from coarsening due to heat.

Accordingly, the electrolytic copper foil of the present invention exhibits excellent characteristics which are not seen in electrolytic copper foils produced by a sulfuric acid-copper sulfate electrolyte using organic additives hitherto such as a low profile and a small drop of mechanical strength even after heating at a high temperature of about 300° C.

It is considered that a thiourea compound which is added to a sulfuric acid-copper sulfate electrolyte forms a complex in the electrolyte together with the metal elements and chlorine.

When tungsten is not added, the metal element added to the electrolyte for forming electrolytic copper foil is copper. Accordingly, a copper-thiourea compound is formed in the electrolyte containing copper sulfate and sulfuric acid. When the electrolytic copper foil is formed by the electrodeposition of copper by this electrolyte, an electrolytic copper foil in which the copper-thiourea compound is adsorbed at the grain boundaries, the growth of crystal nuclei is suppressed, the crystal grains are made finer, and a large mechanical strength is provided in the ordinary state is formed.

However, in this copper foil, the substance existing at the grain boundaries is a copper-thiourea compound, therefore the copper is bonded to the bulk copper crystals or adsorbed, and the substance at the grain boundaries becomes only the thiourea compound. Therefore, it is considered that decomposition occurs when the foil is exposed to a high temperature of about 300° C. and, as a result, the mechanical strength falls.

The reason for the remarkable drop in the tensile strength in the case of heating at a high temperature of about 300° C. is considered to be that, as described above, the compound existing in the grain boundaries is an organic compound, and an organic compound is easily decomposed by heating at about 300° C., therefore the mechanical strength falls.

In the method disclosed in PLTs 1 to 3, different organic compounds are used for the electrolytic deposition to produce electrolytic copper foils. However, all of them are produced from a sulfuric acid-copper sulfate electrolyte containing an organic additive and chlorine, and it is the organic compound ingredient that is adsorbed at the grain boundaries of the electrolytic copper foil. Therefore, the reason for the remarkable drop in the mechanical strength in the case where such an electrolytic copper foil is exposed to a high temperature of 300° C. or more is considered to be that all of the compounds adsorbed at the grain boundaries are organic compounds which are easily decomposed by heating at a high temperature of 300° C. or more.

Contrary to this, the present invention uses an electrolyte obtained by further adding tungsten, a thiourea compound, and chlorine ions to an electrolyte containing copper sulfate and sulfuric acid for copper electrodeposition to form a copper alloy foil, therefore the tungsten oxide is adsorbed onto the copper together with the thiourea compound. An electrolytic copper alloy foil in which the growth of crystal nuclei is suppressed by the adsorbed tungsten oxide and thiourea compound, the crystal grains are made finer, and large mechanical strength is provided in an ordinary state is formed.

In this way, in the electrolytic copper alloy foil of the present invention, the tungsten oxide and thiourea compound are at the grain boundaries. Therefore, unlike the case of a copper-thiourea compound, it is considered that the tungsten oxide is not bonded with or adsorbed at the bulk copper crystals, but the tungsten oxide and thiourea compound remain as they are at the grain boundaries. For this reason, even if the foil is exposed to a high temperature of about 300° C., the tungsten oxide remains at the grain boundaries and acts to prevent the fine crystals of copper from recrystallizing due to heat and the crystals from coarsening.

The amount of tungsten added into the electrolyte is preferably 10 to 1,000 ppm. The reason for setting the amount of addition of tungsten to 10 ppm or more is that the effect of including tungsten does not appear when the amount is less than this and the effect such as improvement of the tensile strength is not improved even if tungsten is contained exceeding 1,000 ppm. Accordingly, the amount of addition of tungsten is preferably set to 10 to 1,000 ppm.

As explained above, it is extremely difficult to squarely incorporate tungsten into copper foil by an electrolyte obtained by adding chlorine ions. In the present invention, however, by adding a thiourea compound, incorporation of tungsten into the copper foil was successful.

The reason for why the amount of the thiourea compound added is set to 3 ppm to 20 ppm is that a prescribed amount of tungsten cannot be incorporated into the copper foil if the amount is less than 3 ppm, therefore the tensile strength after heating at 300° C. for 1 hour becomes 450 MPa or less, while tungsten enters into the copper foil too much if the thiourea compound is added exceeding 20 ppm, therefore the tensile strength becomes too high or elongation becomes small, so property which is not preferred appears. Therefore, the preferred range of the amount of addition is 3 ppm to 20 ppm.

The amount of addition of chlorine ions is 1 to 100 ppm. This is because if the addition of chlorine ions is less than 1 ppm, many pinholes are formed in the foil, therefore this is not preferred, while when the chlorine ions are added exceeding 100 ppm, the inconvenience that the surface roughness becomes remarkably large is manifested. Accordingly, preferably the amount of chlorine ion is controlled to the range of 1 to 100 ppm, particularly preferably 15 to 50 ppm.

The electrolytic copper alloy foil is formed by using a copper sulfate solution obtained by adding the above prescribed amounts of tungsten, the thiourea compound, and chlorine ions as the electrolyte, using titanium coated with a precious metal oxide as the anode, using a rotary drum made of titanium as a cathode, and performing electrolytic treatment under conditions of a current density of 30 to 100 A/dm$^2$ and solution temperature of 30 to 70° C.

By forming the foil under such conditions, the peak intensity ratio I<220>/I<200> obtained by X-ray diffraction can be made 1.2 or more, and incorporation of tungsten into the electrolytic copper foil can be promoted.

Preferably, the mechanical strength after heating at 300° C. for 1 hour of the electrolytic copper alloy foil formed by adding ammonium ions or nitrate ions to the electrolyte of the present invention can be further improved.

The amount of the ammonium ions added to the electrolyte is suitably 1 to 15 g/liter, while the amount of the nitrate ions is suitably 50 to 200 mg/liter. When further improving the mechanical strength after the heat treatment, preferably ammonia ions or nitrate ions are added to the electrolyte.

By using the electrolyte and forming the foil with the proper current density and solution temperature, an electrolytic copper alloy foil in which the tensile strength after heating at 300° C. for 1 hour is 450 MPa or more, the elongation after heating at 300° C. for 1 hour is 3.5% or more, and the conductivity is 80% or more can be produced.

As explained above, the current collector (copper foil) forming the negative electrode current collector of the lithium ion secondary cell must be durable against the usual heat treatment of 300° C. for 1 hour when using a polyimide binder. That is, the surface of the current collector for lithium ion secondary cell use is coated with an active material composition made into a paste state by adding a solvent or the like to a mixture of an active material, conductive material, and binder and the result is dried to obtain a negative electrode of the lithium ion secondary cell. In that drying process, a heat treatment at 300° C. for 1 hour is needed. As the copper foil which is durable against the heating conditions in this drying process and durable against the expansion and contraction by the charging-discharging cycle of the active material, a performance satisfying the conditions of a tensile strength after heating at 300° C. for 1 hour of 450 MPa or more and elongation of 3.5% or more is necessary.

Further, Si, Sn, and other active materials have a poor electron conductivity compared with an active material such as carbon. If the conductivity of the active material is bad, the internal resistance of the electrode rises, therefore the cycle characteristics deteriorate. For this reason, a conductivity of 80% or more is demanded from the copper foil as the current collector.

The Cu—W alloy foil of the present invention satisfies the various characteristics demanded by the current collector for secondary cell use described above. Accordingly, by using such an electrolytic copper alloy foil as the current collector, depositing silicon, germanium, tin, or an alloyed compound of them or an active material containing them as principal ingredients on the current collector to form an electrode and assembling the electrode, a lithium ion secondary cell having excellent performance can be produced.

EXAMPLES

Example A

Electrolytes containing copper sulfate and sulfuric acid obtained by adding copper, sulfuric acid, chlorine ion, tungsten, and thiourea organic additives in the amounts shown in Table 1 were used to form electrolytic copper alloy foils under the following electrolytic conditions using a precious metal oxide-coated titanium as the anode and a rotary drum made of titanium as the cathode:

Electrolytic Conditions

Current density: 30 to 100 A/dm$^2$

Temperature: 30 to 70° C.

Note that, "after heating" means after heating at 300° C. for 1 hour in an inert gas atmosphere

TABLE 1

| | | | Solution concentration | | | | | Foil-form condition | Content in alloy foil | |
|---|---|---|---|---|---|---|---|---|---|---|
| | | Organic compound | Cu g/l | $H_2SO_4$ g/l | Cl ppm | Organic matter ppm | W ppm | Current density A/dm$^2$ | W Wt % | Cl Wt % |
| Ex. (optimal range) | 1-1 | Thiourea | 70 | 50 | 30 | 2.0 | 100 | 40 | 0.0180 | 0.0200 |
| | 1-2 | | 70 | 50 | 10 | 6.5 | 30 | 40 | 0.0050 | 0.0100 |
| | 1-3 | | 100 | 90 | 10 | 15.0 | 200 | 40 | 0.0353 | 0.0132 |
| | 1-4 | | 50 | 40 | 30 | 3.0 | 30 | 40 | 0.0140 | 0.0230 |
| | 1-5 | Ethylene thiourea | 70 | 50 | 30 | 5.0 | 100 | 40 | 0.0230 | 0.0200 |
| | 1-6 | | 70 | 50 | 30 | 3.0 | 150 | 40 | 0.0212 | 0.0200 |
| | 1-7 | | 100 | 90 | 10 | 20.0 | 1000 | 40 | 0.0545 | 0.0160 |
| | 1-8 | | 70 | 50 | 30 | 7.0 | 80 | 40 | 0.0208 | 0.0230 |
| | 1-9 | | 70 | 50 | 50 | 5.0 | 100 | 40 | 0.0130 | 0.0330 |
| | 1-10 | Tetra-methyl thiourea | 70 | 50 | 30 | 6.0 | 10 | 40 | 0.0017 | 0.0080 |
| | 1-11 | | 70 | 50 | 10 | 6.0 | 30 | 40 | 0.0040 | 0.0160 |
| | 1-12 | | 100 | 90 | 30 | 9.0 | 50 | 40 | 0.0120 | 0.0280 |
| | 1-13 | | 50 | 40 | 50 | 3.0 | 10 | 40 | 0.0015 | 0.0230 |
| | 1-14 | | 70 | 50 | 30 | 3.0 | 10 | 60 | 0.0010 | 0.0170 |
| | 1-15 | N,N-diethyl thiourea | 70 | 50 | 30 | 5.0 | 100 | 40 | 0.0180 | 0.0180 |
| | 1-16 | | 90 | 65 | 10 | 13.0 | 200 | 40 | 0.0460 | 0.0060 |
| | 1-17 | | 70 | 50 | 50 | 7.0 | 100 | 40 | 0.0192 | 0.0400 |
| Ex. (good Range) | 1-18 | Thiourea | 70 | 50 | 30 | 1.5 | 8 | 40 | 0.0003 | 0.0223 |
| | 1-19 | | 100 | 90 | 4 | 22.0 | 1010 | 40 | 0.0560 | 0.0050 |
| | 1-20 | | 70 | 50 | 30 | 1.5 | 100 | 40 | 0.0150 | 0.0230 |
| | 1-21 | | 70 | 50 | 60 | 4.0 | 50 | 40 | 0.0001 | 0.0350 |
| | 1-22 | Ethylene thiourea | 70 | 50 | 30 | 3.0 | 45 | 40 | 0.0004 | 0.0302 |
| | 1-23 | | 70 | 50 | 8 | 22.0 | 1010 | 40 | 0.0580 | 0.0071 |
| | 1-24 | Tetra-methyl thiourea | 70 | 50 | 30 | 1.5 | 30 | 80 | 0.0003 | 0.0162 |
| | 1-25 | | 70 | 50 | 5 | 21.0 | 1010 | 40 | 0.0592 | 0.0055 |
| | 1-26 | | 70 | 50 | 60 | 12.0 | 7 | 80 | 0.0002 | 0.0054 |
| | 1-27 | N,N-diethyl thiourea | 70 | 50 | 5 | 21.0 | 1010 | 40 | 0.0570 | 0.0110 |

| | | | Copper foil characteristics | | | | | |
|---|---|---|---|---|---|---|---|---|
| | | Organic compound | Strength at ord. temp. MPa | Strength after heating MPa | Elongation at ord. temp. % | Elongation after heating % | Conductivity % | Cell performance Deformation of foil |
| Ex. (optimal range) | 1-1 | Thiourea | 650 | 496 | 2.8 | 6.2 | 92 | No wrinkles or other changes |
| | 1-2 | | 720 | 465 | 2.5 | 6.8 | 94 | No wrinkles or other changes |
| | 1-3 | | 650 | 530 | 3.5 | 4.3 | 80 | No wrinkles or other changes |

TABLE 1-continued

|  |  |  |  |  |  |  |  |  |
|---|---|---|---|---|---|---|---|---|
|  | 1-4 |  | 660 | 510 | 2.5 | 5.1 | 93 | No wrinkles or other changes |
|  | 1-5 | Ethylene thiourea | 720 | 520 | 3.3 | 4.6 | 87 | No wrinkles or other changes |
|  | 1-6 |  | 660 | 480 | 4.3 | 6.1 | 90 | No wrinkles or other changes |
|  | 1-7 |  | 800 | 601 | 4.2 | 3.9 | 80 | No wrinkles or other changes |
|  | 1-8 |  | 788 | 510 | 3.3 | 4.2 | 90 | No wrinkles or other changes |
|  | 1-9 |  | 680 | 475 | 4.7 | 7.1 | 89 | No wrinkles or other changes |
|  | 1-10 | Tetra-methyl thiourea | 710 | 454 | 3.3 | 7.3 | 97 | No wrinkles or other changes |
|  | 1-11 |  | 740 | 463 | 2.5 | 6.9 | 90 | No wrinkles or other changes |
|  | 1-12 |  | 750 | 450 | 3.1 | 7.0 | 93 | No wrinkles or other changes |
|  | 1-13 |  | 650 | 452 | 3.6 | 7.1 | 97 | No wrinkles or other changes |
|  | 1-14 |  | 680 | 450 | 3.4 | 6.8 | 95 | No wrinkles or other changes |
|  | 1-15 | N,N-diethyl thiourea | 652 | 476 | 2.9 | 6.9 | 86 | No wrinkles or other changes |
|  | 1-16 |  | 730 | 530 | 3.4 | 4.5 | 80 | No wrinkles or other changes |
|  | 1-17 |  | 663 | 479 | 3.2 | 7.2 | 87 | No wrinkles or other changes |
| Ex. (good Range) | 1-18 | Thiourea | 500 | 320 | 4.3 | 4.8 | 83 | Wrinkles |
|  | 1-19 |  | 535 | 410 | 5.2 | 8.3 | 75 | Wrinkles |
|  | 1-20 |  | 500 | 400 | 4.3 | 4.8 | 81 | Wrinkles |
|  | 1-21 |  | 520 | 360 | 4.3 | 4.6 | 83 | Wrinkles |
|  | 1-22 | Ethylene thiourea | 640 | 400 | 2.6 | 3.4 | 88 | Wrinkles |
|  | 1-23 |  | 800 | 440 | 3 | 3.5 | 70 | Some wrinkles |
|  | 1-24 | Tetra-methyl thiourea | 600 | 445 | 4.8 | 6.3 | 81 | Some wrinkles |
|  | 1-25 |  | 560 | 428 | 3.3 | 4.4 | 72 | Wrinkles |
|  | 1-26 |  | 630 | 300 | 3.7 | 6 | 82 | Wrinkles |
|  | 1-27 | N,N-diethyl thiourea | 660 | 425 | 2.8 | 3.5 | 71 | Some wrinkles |

Rustproofing

The electrolytic copper alloy foils formed in this way were treated for rustproofing under the following conditions.

The formed electrolytic copper alloy foils (untreated copper alloy foils) were dipped in an aqueous solution of 1 g/liter of $CrO_3$ for 5 seconds to apply chromate treatment, then were washed by water and then dried.

Note that, here, a chromate treatment was carried out, but naturally a benzotriazole treatment or silane coupling agent treatment may be carried out or silane coupling agent treatment may be carried out after the chromate treatment.

Comparative Example

Electrolytes containing copper sulfate and sulfuric acid obtained by adding copper, sulfuric acid, chlorine, tungsten, a thiourea organic additive, or glue in the amounts shown in Table 2 were used to form electrolytic copper alloy foils under the following electrolytic conditions by using precious oxide-coated titanium as the anode and a rotary drum made of titanium as the cathode.
Electrolytic Conditions
Current density: 10 to 40 $A/dm^2$
Temperature: 30 to 70° C.

The copper foils formed in this way were treated on their surfaces in the same way as the examples.

The prepared copper foils were tested as follows.

Measurement of Content of Tungsten in Copper Alloy Foil

The tungsten content was found by dissolving a constant weight of electrolytic copper alloy foil by acid, then measuring tungsten in the solution by ICP emission spectrum analysis.

Used apparatus: ICPS-7000 (Shimadzu Corporation)

Measurement of Tensile Strength and Elongation of Copper Alloy Foil

The tensile strength and elongation of the copper alloy foil were measured for foils before heating and after heating based on the IPC-TM-650.

Used apparatus: AG-1 (Shimadzu Corporation)

Measurement of Conductivity

The conductivity was calculated by first measuring the resistance value of 20×200 mm length copper foil, then dividing the measured resistance value by the cross-sectional area of the copper foil.

The resistance value was measured based on JIS-K6271 by the four-terminal method (current-voltage method).

Measurement of Chlorine Content

The chlorine content was calculated by dissolving a constant weight of electrolytic copper alloy foil by acid, then assaying the chlorine in the solution by titration of silver nitrate.

Analysis of Tungsten

The chemical bonding state and electron state of the tungsten contained in the electrolytic copper alloy were analyzed by the XAFS (X-ray absorption fine structure) method. In the XAFS method, samples were irradiated by X-rays while changing the X-ray energy. From the obtained X-ray absorption spectrum, the chemical bonding state and electron state in the samples wererere analyzed.

Other than this, as the technique of obtaining the X-ray absorption spectrum, there are a transmission method of finding the X-ray absorption spectrum from the intensity of the incident X-rays and the intensity of the transmitted X-rays and a fluorescence method of measuring the intensity

TABLE 2

| | | | Solution concentration | | | | Foil-form Conditions | Content in alloy foil | |
|---|---|---|---|---|---|---|---|---|---|
| | | Organic compound | Cu g/l | $H_2SO_4$ g/l | Cl ppm | Organic matter ppm | W ppm | Current density $A/dm^2$ | W wt % | Cl wt % |
| Comp. ex. | 1-1 | Ethylene thiourea | 70 | 50 | 30 | 1.5 | 100 | 10 | 0 | 0.0200 |
| | 1-2 | N,N-diethyl thiourea | 70 | 50 | 30 | 1.5 | 8 | 40 | 0 | 0.0150 |
| | 1-3 | Glue | 70 | 50 | 30 | 100.0 | 200 | 40 | 0 | 0.0011 |
| | 1-4 | | 70 | 50 | 30 | 3.0 | 200 | 40 | 0 | 0.0010 |

| | | | Copper foil characteristics | | | | | Cell performance |
|---|---|---|---|---|---|---|---|---|
| | | Organic compound | Strength at ord. temp. MPa | Strength after heating MPa | Elongation at ord. Temp. % | Elongation after heating % | Conductivity % | Deformation of foil |
| Comp. ex. | 1-1 | Ethylene thiourea | 430 | 210 | 6.1 | 7.8 | 90 | Large deformation |
| | 1-2 | N,N-diethyl thiourea | 440 | 230 | 4.1 | 6.2 | 90 | Large deformation |
| | 1-3 | Glue | 420 | 205 | 2.7 | 4.1 | 98 | Large deformation |
| | 1-4 | | 400 | 200 | 2.5 | 3.5 | 99 | Large deformation | of the fluorescence X-rays emitted from the sample along with the absorption of the X-rays.

When a metal material or other additive element is the subject for analysis, the amount of addition is very small. Therefore it is difficult to obtain the XAFS spectrum by the transmission method. It is the fluorescence method described above that is effective in such a case. The characteristic feature of the fluorescence method resides in that a wide irradiation area of X-rays can be taken from its optical axis system, therefore XAFS measurement is possible even for elements which are very small in amount.

The present measurement was carried out for the purpose of learning the chemical bonding state and electron state of tungsten in high strength copper foil. Since the amount of tungsten is very small and it is difficult to obtain the XAFS spectrum by the transmission method, the fluorescence method was selected.

For measurement, use was made of the Engineering Science Research Beamline BL14B2 of SPring-8. The energy range of the measured X-rays was made 10000 to 10434 eV. Within this energy range, there is an L3-absorption end (10207 eV) of tungsten, therefore this is suitable for the purpose of the present measurement.

An example of the measurement will be shown in FIG. 1.

As the measurement sample, copper foil (Example 23) containing 0.058 wt % of tungsten was prepared. Further, for comparison, tungsten foil and $WO_3$ were prepared. The measurement time was made 4 hours per sample. The spectrum of the tungsten-containing copper foil had a peak in an energy region almost coincident with the spectrum of not tungsten, but $WO_3$. Therefore, it was seen that the tungsten element in the electrolytic copper foil was contained in the oxide state. As a result of measurement for examples based on this result, it was confirmed that tungsten was contained in the oxide state.

Cell Performance Test

Next, using the electrolytic copper foils formed in the examples as the current collectors, lithium secondary cells were prepared, and cycle life tests were carried out.

A powder-shaped Si alloy active material (mean particle diameter: 0.1 μm to 10 μm) in a ratio (weight ratio) of 85 and a binder (polyimide) in a ratio of 15 were mixed, and the mixture was dispersed in N-methylpyrrolidone (solvent) to form an active material slurry.

Then, this slurry was coated on the two surfaces of the prepared electrolytic copper foil having a thickness of 12 μm. The foil was dried and then press formed by a roller press machine. After that, it was annealed at 300° C. for 1 hour under a nitrogen atmosphere to form a negative electrode. In this negative electrode, the film thicknesses of the negative electrode mixture at the two surfaces after shaping were the same 20 μm.

Preparation of Lithium Secondary Cell

In a glovebox in an argon atmosphere, three-electrode type cells for evaluation use were constructed by the following configuration.

Negative electrode: Si alloy negative electrode prepared as described above

Counter electrode, reference electrode: Lithium foil

Electrolyte: 1 mol/liter of $LiPF_6$/EC+DEC (3:7 vol %)

The constructed cells were taken out of the box into the atmosphere and were measured for charging/discharging life in the atmosphere at 25° C.

Charging was carried out by a constant current up to 0.02V with respect to the standard single-electrode potential reference of Li. After that, charging was ended at the point of time when the current of CV (constant potential as it was) was lowered by 0.05 C. Discharge was carried out up to 1.5V (Li reference) with the constant current by 0.1 C. Charging/discharging was repeated with the same current corresponding to 0.1 C.

For evaluation of the charging/discharging performances, after performing 100 cycles of charging/discharging, the cells were disassembled and deformation and breakage of foil were checked for. The results thereof are shown in Tables 1 and 2.

The tungsten content of the tungsten-containing electrolytic copper foil is preferably 0.0001 to 0.060 wt %, particularly preferably 0.001 to 0.055 wt %. When out of this range, wrinkles were formed after the charging/discharging test.

TABLE 3

| | Electrolyte | | | Characteristics of copper foil | | | | |
| | | | Foil-form | | Tensile | Tensile | | |
| | Organic additive | W | condition Current | W content | strength before | strength after | Cell characteristics | |
| | Organic additive | concentration (ppm) | concentration in bath (ppm) | density (A/dm²) | I (220)/ I (200) | in alloy foil (wt %) | heating (MPa) | heating (MPa) | Cycle life | Deformation of foil |
|---|---|---|---|---|---|---|---|---|---|---|
| Ex. 2-1 | Thiourea | 3 | 10 | 20 | 5.3 | 0.0035 | 660 | 462 | 113 | Good |
| Ex. 2-2 | | | | 40 | 7.4 | 0.0066 | 676 | 468 | 123 | Good |
| Ex. 2-3 | | | | 60 | 1.6 | 0.0019 | 673 | 454 | 105 | Good |
| Ex. 2-4 | | 10 | 100 | 20 | 8.0 | 0.0208 | 670 | 483 | 139 | Good |
| Ex. 2-5 | | | | 40 | 9.3 | 0.0241 | 709 | 496 | 153 | Good |
| Ex. 2-6 | | | | 60 | 4.0 | 0.0157 | 702 | 472 | 131 | Good |
| Ex. 2-7 | | 20 | 1000 | 20 | 10.6 | 0.0372 | 763 | 537 | 162 | Good |
| Ex. 2-8 | | | | 40 | 11.9 | 0.0469 | 758 | 563 | 168 | Good |
| Ex. 2-9 | | | | 60 | 4.5 | 0.0224 | 755 | 510 | 157 | Good |
| Ex. 2-10 | Ethylene thiourea | 3 | 10 | 20 | 6.1 | 0.0067 | 649 | 468 | 124 | Good |
| Ex. 2-11 | | | | 40 | 7.7 | 0.0077 | 667 | 476 | 133 | Good |
| Ex. 2-12 | | | | 60 | 4.8 | 0.0043 | 661 | 465 | 115 | Good |
| Ex. 2-13 | | 10 | 10 | 20 | 6.6 | 0.0081 | 720 | 509 | 150 | Good |
| Ex. 2-14 | | | | 40 | 8.1 | 0.0104 | 740 | 513 | 160 | Good |
| Ex. 2-15 | | | | 60 | 3.4 | 0.0041 | 745 | 507 | 142 | Good |
| Ex. 2-16 | | | 100 | 20 | 8.8 | 0.0220 | 721 | 514 | 158 | Good |
| Ex. 2-17 | | | | 40 | 9.4 | 0.0258 | 748 | 520 | 163 | Good |
| Ex. 2-18 | | | | 60 | 6.1 | 0.0175 | 742 | 509 | 148 | Good |

TABLE 3-continued

|  | Electrolyte | | | Foil-form condition | | Characteristics of copper foil | | | | |
|---|---|---|---|---|---|---|---|---|---|---|
|  | Organic additive | W | | Current | | W content | Tensile strength before | Tensile strength after | Cell characteristics | |
|  | Organic additive | concentration (ppm) | concentration in bath (ppm) | density (A/dm$^2$) | I (220)/ I (200) | in alloy foil (wt %) | heating (MPa) | heating (MPa) | Cycle life | Deformation of foil |
| Ex. 2-19 |  |  | 1000 | 20 | 9.0 | 0.0289 | 734 | 559 | 167 | Good |
| Ex. 2-20 |  |  |  | 40 | 12.3 | 0.0503 | 756 | 609 | 173 | Good |
| Ex. 2-21 |  |  |  | 60 | 7.2 | 0.0248 | 756 | 543 | 168 | Good |
| Ex. 2-22 |  | 20 | 1000 | 20 | 12.9 | 0.0518 | 775 | 609 | 180 | Good |
| Ex. 2-23 |  |  |  | 40 | 13.2 | 0.0533 | 788 | 610 | 179 | Good |
| Ex. 2-24 |  |  |  | 60 | 8.1 | 0.0284 | 786 | 557 | 164 | Good |
| Ex. 2-25 | N,N- | 3 | 10 | 20 | 5.1 | 0.0042 | 655 | 468 | 115 | Good |
| Ex. 2-26 | diethyl |  |  | 40 | 7.0 | 0.0063 | 670 | 473 | 133 | Good |
| Ex. 2-27 | thiourea |  |  | 60 | 2.2 | 0.0016 | 684 | 452 | 105 | Good |
| Ex. 2-28 |  | 10 | 100 | 20 | 7.5 | 0.0203 | 701 | 504 | 147 | Good |
| Ex. 2-29 |  |  |  | 40 | 9.5 | 0.0250 | 739 | 519 | 160 | Good |
| Ex. 2-30 |  |  |  | 60 | 3.3 | 0.0139 | 737 | 475 | 132 | Good |
| Ex. 2-31 |  | 20 | 1000 | 20 | 9.3 | 0.0309 | 741 | 558 | 165 | Good |
| Ex. 2-32 |  |  |  | 40 | 11.2 | 0.0454 | 750 | 680 | 170 | Good |
| Ex. 2-33 |  |  |  | 60 | 3.3 | 0.0195 | 754 | 543 | 167 | Good |
| Ex. 2-34 | Tetra- | 3 | 10 | 20 | 2.1 | 0.0014 | 693 | 453 | 106 | Good |
| Ex. 2-35 | methyl |  |  | 40 | 3.4 | 0.0021 | 691 | 466 | 130 | Good |
| Ex. 2-36 | thiourea |  |  | 60 | 1.2 | 0.0010 | 680 | 452 | 103 | Good |

TABLE 4

|  | Electrolyte | | | Foil-form condition | | Copper foil | | | | |
|---|---|---|---|---|---|---|---|---|---|---|
|  | Organic additive | W | | Current | | W content in | Tensile strength | Tensile strength | Cell characteristics | |
|  | Organic additive | concentration (ppm) | concentration in bath (ppm) | density (A/dm$^2$) | I (220)/ I (200) | alloy foil (wt %) | before heating (MPa) | after heating (MPa) | Cycle life | Deformation of foil |
| Comp. Ex. 2-1 | Thiourea | 3 | 50 | 80 | 0.7 | 0 | 754 | 351 | 73 | x |
| Comp. Ex. 2-2 |  | 20 | 200 | 10 | 0.9 | 0 | 310 | 211 | 81 | x |
| Comp. Ex. 2-3 | Ethylene thiourea | 3 | 50 | 80 | 0.8 | 0 | 748 | 350 | 72 | x |
| Comp. Ex. 2-4 |  | 20 | 200 | 10 | 0.9 | 0 | 321 | 227 | 79 | x |
| Comp. Ex. 2-5 | N,N- diethyl | 3 | 50 | 80 | 0.9 | 0 | 757 | 349 | 70 | x |
| Comp. Ex. 2-6 | thiourea | 20 | 200 | 10 | 0.8 | 0 | 309 | 201 | 82 | x |
| Comp. Ex. 2-7 | Glue | 3 | 50 | 20 | 0.4 | 0 | 359 | 185 | 41 | x |
| Comp. Ex. 2-8 |  |  |  | 40 | 0.7 | 0 | 407 | 198 | 49 | x |
| Comp. Ex. 2-9 |  |  |  | 60 | 0.3 | 0 | 362 | 189 | 42 | x |
| Comp. Ex. 2-10 |  | 10 | 100 | 20 | 0.5 | 0 | 361 | 195 | 47 | x |
| Comp. Ex. 2-11 |  |  |  | 40 | 0.7 | 0 | 417 | 206 | 52 | x |
| Comp. Ex. 2-12 |  |  |  | 60 | 0.4 | 0 | 358 | 188 | 40 | x |
| Comp. Ex. 2-13 |  | 20 | 200 | 20 | 0.2 | 0 | 369 | 205 | 53 | x |
| Comp. Ex. 2-14 |  |  |  | 40 | 0.9 | 0 | 423 | 210 | 58 | x |
| Comp. Ex. 2-15 |  |  |  | 60 | 0.7 | 0 | 361 | 195 | 49 | x |

Example B

The following bath composition was set as the basic bath composition of the electrolyte containing copper sulfate and sulfuric acid.
Cu=50 to 150 g/liter
$H_2SO_4$=20 to 200 g/liter
Cl=1 to 100 ppm
Organic additives shown in Table 5=3 to 20 ppm

TABLE 5

Thiourea
Ethylene thiourea
N,N-diethylthiourea
Tetramethylthiourea

In the above bath, as additives, sodium tungstate and the thiourea, ethylene thiourea, N,N-diethylthiourea, and tetramethylthiourea shown in Table 5 were added so as to obtain the concentrations shown in Table 3 and electrolytic copper alloy foils were formed to a thickness of 12 μm with current densities shown in Table 3.

The electrolytic copper alloy foils formed in this way were treated for rust proofing under the following conditions.

The formed electrolytic copper alloy foils (untreated copper alloy foils) were dipped in 1 g/liter of $CrO_3$ aqueous solution for 5 seconds to apply the chromate treatment, were washed with water, and then were dried.

Note that, the chromate treatment was carried out here, but naturally benzotriazole treatment or silane coupling agent treatment may be carried out or silane coupling agent treatment may be carried out after the chromate treatment.

The copper alloy foils prepared in this way were measured and tested as follows. The results thereof are shown in Table 3.

(1) Measurement of Crystal Orientation (XRD)
The crystal orientation of the copper foil was measured by X-ray diffraction (XRD).
Used apparatus: RAD-B (Rigaku Corporation)
Conditions: CuKα
Scanning method: θ-2θ
Tube voltage: 40 kV
Tube current: 20 mA
Measurement range: 20 to 100

(2) Measurement of Tungsten Content in Foil (ICP)
The tungsten content in the copper alloy foil was obtained by dissolving a constant amount of copper alloy foil by acid, then diluting this by distilled water and measuring the thus prepared sample by using inductively coupled plasma (ICP) atomic emission spectrometry.
Used apparatus: ICPS-700 (Shimadzu Corporation)

(3) Measurement of Tensile Strength
The tensile strength of the copper alloy foil was measured based on the IPC-TM-650 for the foil before heating and after heating.
Used apparatus: AG-I (Shimadzu Corporation)

(4) Cell Performance Test
Next, using the electrolytic copper foils formed in the examples as the current collectors, lithium secondary cells were prepared, and cycle life tests were carried out.

A powder-shaped Si alloy active material (mean particle diameter: 0.1 μm to 10 μm) in a ratio (weight ratio) of 85 and a binder (polyimide) in a ratio of 15 were mixed, and the mixture was dispersed in N-methylpyrrolidone (solvent) to form an active material slurry.

Then, this slurry was coated on the two surfaces of the prepared electrolytic copper foil having a thickness of 12 μm. The foil was dried and then press formed by a roller press machine. After that, it was annealed at 300° C. for 1 hour under a nitrogen atmosphere to form a negative electrode. In this negative electrode, the film thicknesses of the negative electrode mixture at the two surfaces after shaping were the same 20 μm.

Preparation of Lithium Secondary Cell
In a glovebox in an argon atmosphere, three-electrode type cells for evaluation use were constructed by the following configuration.
Negative electrode: Si alloy negative electrode prepared as described above
Counter electrode, reference electrode: Lithium foil
Electrolyte: 1 mol/liter of $LiPF_6$/EC+DEC (3:7 vol %)

The constructed cells were taken out of the box into the atmosphere and were measured for charging/discharging life in the atmosphere at 25° C.

Charging was carried out by a constant current up to 0.02V with respect to the standard single-electrode potential reference of Li. After that, charging was ended at the point of time when the current of CV (constant potential as it was) was lowered by 0.05 C. Discharge was carried out up to 1.5V (Li reference) with the constant current by 0.1 C. Charging/discharging was repeated with the same current corresponding to 0.1 C.

For evaluation of the charging/discharging performances, the number of cycles until the discharge capacity reached 70% of the discharge capacity in the first cycle was measured. An electrode having a cycle number of 100 or more was judged as useable in practice and deemed as a passing level. The numbers of cycles of electrodes produced under different conditions are shown in Table 3 and Table 4.

Further, the cells were disassembled after the end of the charging/discharging tests and the electrodes (copper foils) used as the materials of the negative electrode current collectors were checked for any deformation. The results are indicated as "Good" for cells without wrinkles and other deformation and as "Poor" for cells with wrinkles and other deformation deemed as not passing.

Comparative Examples 1 to 15

The following bath composition was used as the basic bath composition of the electrolyte containing copper sulfate and sulfuric acid. Cu=50 to 150 g/liter
$H_2SO_4$=20 to 200 g/liter
Cl=1 to 100 ppm In the above bath, in the same way as the examples, as additives, sodium tungstate and thiourea, ethylene thiourea, N,N-diethylthiourea, and glue were added so as to obtain the concentrations shown in Table 4, and electrolytic copper foils were formed to a thickness of 12 μm with current densities shown in Table 4.

The formed copper foils were evaluated in the same way as the examples and were measured for the crystal orientation of the foil, tungsten concentration in the foil, tensile strengths before and after the heat treatment, and cell characteristics. The results thereof are shown in Table 4.

Table 3 shows the results of evaluation of the copper foils prepared in Examples 1 to 36. It can be confirmed that the peak intensity ratio I<220>/I<200> obtained by X-ray diffraction changes in each sample due to the change of the additive concentration and current density. In all of the copper foils shown in Table 3, the peak intensity ratio obtained by the X-ray diffraction, i.e., I<220>/I<200>, is 1.2 or more. By being controlled to a crystal orientation where tungsten is easily incorporated, in the foil, tungsten is incorporated into the foil in an amount of 0.001 wt % to 0.055 wt %.

It is seen that when the amount of tungsten in the electrolytic bath is increased, the amount of tungsten incorporated into the foil tends to increase. Further, it was seen that the tensile strength after heating is 450 MPa or more and the heat resistance is excellent.

When looking at the tensile strength after heating at 300° C. for 1 hour, in all foils, it was 450 MPa or more. The heat resistance was excellent, and no deformation of foil could be confirmed after the cycle test under all conditions either. More preferably, under conditions giving an amount of incorporation of tungsten of 0.001 wt % or more, the tensile strength after heating at 300° C. for 1 hour was 450 MPa or more, the heat resistance was more excellent, and the number of cycles of the cell was 100 or more or usable in practice, so preferred characteristics were exhibited. Further, among them, in a foil having an amount of incorporation of tungsten larger than 0.055 wt %, the foil easily breaks and formation of foil is difficult, therefore the most preferred amount of incorporation of tungsten in the foil is 0.001 to 0.055 wt %.

Table 4 shows the results of evaluation of Comparative Examples 1 to 15.

The copper foils in Comparative Examples 1 to 6 show the results of samples prepared by using the same electrolyte as that for the examples but under different electrodeposition conditions (current density). However, it was confirmed that the peak intensity ratio obtained by the X-ray diffraction, i.e., I<220>/I<200>, was less than 1.2, and a crystal orientation considered to contribute to the incorporation of tungsten was not exhibited. Further, the amount of incorporation of tungsten was less than 0.0001 wt % which was the detection limit for all irrespective of the tungsten concentration in the electrolytic bath, therefore almost no tungsten was incorporated. It was clarified that the tensile strength after heating at 300° C. for 1 hour was 450 MPa or less and that the heat resistance was very low.

Further, the copper foils in Comparative Examples 7 to 15 formed by adding glue which is generally used as an additive did not show a crystal orientation whereby the peak intensity ratio obtained by X-ray diffraction, i.e. I<220>/I<200>, became 1.2 or more under any electrolytic condition. In all samples, the amount of incorporation of tungsten was 0 wt % and the tensile strength after heating was 250 MPa, therefore a very low heat resistance was shown.

In cells using the electrolytic copper foils of the comparative examples, after the cycle tests, deformation was seen in all electrolytic copper foils. Further, the numbers of cycles of the cells were 85 or less, so the characteristics were not preferred.

By the Cu—W alloy foil having the above characteristics, the excellent effects are exhibited that it is possible to provide an electrolytic copper foil free from breakage of the current collector (copper foil) while keeping the adhesion between the collector (copper foil) and the active material in the face of large expansion and contraction of the silicon or tin alloy active material and it is possible to provide an excellent lithium secondary cell by using the electrolytic copper foil as a negative electrode current collector.

Example C

In the present example, as the electrolyte, a copper sulfate solution prepared to have a copper concentration of 50 to 150 g/liter, a free sulfuric acid concentration of 20 to 200 g/liter, and a chlorine ion concentration of 1 to 100 ppm was used as the basic solution. The thiourea compound used as the additive and its added concentration and the tungsten concentration are shown in Table 6 together so that they can be compared with the comparative examples.

Setting of chlorine concentration of the basic solution to 100 ppm or less was made since no difference was seen in the mechanical characteristic of the foil even when it was added exceeding 100 ppm.

In the present example, copper alloy foils of 12 μm were produced by using the above electrolyte. The production conditions are a current density of 30 to 100 A/dm² and a temperature of 30 to 70° C.

The tungsten contents in the produced copper foils were calculated by dissolving a constant weight of electrolytic copper alloy foil by acid and finding the amount of tungsten in the solution by ICP atomic emission spectrometry.

The tensile strengths and elongations of the copper alloy foils were measured based on IPC-TM-650 for foils before heating and after heating. The results are shown in Table 6 together with the comparative examples. Used apparatus: AG-I (Shimadzu Corporation)

TABLE 6

| | | Organic additive | | W | W content in alloy foil wt % | Copper foil characteristic | | |
|---|---|---|---|---|---|---|---|---|
| | | Name of compound | Concentration in solution Ppm | Concentration in solution ppm | | Strength at ordinary temperature MPa | Strength after heat treatment MPa | Conductivity % |
| Ex. | 3-1 | Ethylene thiourea | 3 | 60 | 0.0090 | 661 | 464 | 90 |
| | 3-2 | | 7 | 50 | 0.0090 | 689 | 503 | 89 |
| | 3-3 | | 10 | 50 | 0.0100 | 773 | 517 | 88 |
| | 3-4 | | 5 | 100 | 0.0100 | 727 | 538 | 86 |
| | 3-5 | | 7 | 100 | 0.0110 | 750 | 520 | 85 |
| | 3-6 | | 10 | 100 | 0.0120 | 793 | 549 | 85 |
| | 3-7 | | 5 | 150 | 0.0150 | 723 | 536 | 86 |
| | 3-8 | | 7 | 150 | 0.0170 | 750 | 555 | 85 |
| | 3-9 | | 10 | 150 | 0.0180 | 788 | 561 | 85 |
| | 3-10 | | 5 | 200 | 0.0180 | 701 | 509 | 82 |
| | 3-11 | | 7 | 200 | 0.0180 | 726 | 512 | 81 |
| | 3-12 | | 10 | 200 | 0.0190 | 751 | 499 | 80 |

TABLE 6-continued

| | | | | | | | | |
|---|---|---|---|---|---|---|---|---|
| 3-13 | Thiourea | 20 | 100 | 0.0150 | 708 | 453 | 82 | |
| 3-14 | N,N-diethyl thiourea | 10 | 100 | 0.0130 | 733 | 503 | 83 | |
| 3-15 | Tetramethyl thiourea | 6 | 10 | 0.0010 | 720 | 490 | 92 | |
| 3-16 | *7 g/l of ammonium ions contained in Examples 1 to 4 | | | 0.0110 | 730 | 545 | 86 | |
| 3-17 | *130 mg/l of nitrate ions contained in Examples 1 to 4 | | | 0.0100 | 731 | 540 | 88 | |

| | | Organic compound | | W | W | Copper foil characteristics | | |
|---|---|---|---|---|---|---|---|---|
| | | Name of compound | Concentration in solution ppm | Concentration in solution ppm | content in alloy foil wt % | Strength at ordinary temperature MPa | Strength after heat treatment MPa | Conductivity % |
| Comp. ex. | 3-1 | No organic additive | — | 100 | 0 | 428 | 208 | 99 |
| | 3-1 | Glue | 3 | 100 | 0 | 440 | 210 | 97 |

From the evaluation results shown in Table 6, the electrolytic copper alloy foils in Examples 3-1 to 3-15 have mechanical strengths after heating at 300° C. for 1 hour exceeding 450 MPa. It is proved that the adhesion between the collector and the active material is maintained by the polyimide binder and the current collector is not broken despite large expansion and contraction of the Si or Sn alloy active material.

Example 3-16 is produced by using an electrolyte comprised of the electrolyte of Example 3-4 further containing 7 g/liter of ammonium ions. Further, Example 3-17 is produced by using an electrolyte comprised of the electrolyte of Example 3-4 further containing 130 mg/liter of nitrate ions.

The electrolytic copper alloy foils in Example 3-16 and Example 3-17 are increased in mechanical strength after heating at 300° C. for 1 hour compared with Example 3-4. When the mechanical strength after heat treatment is to be further improved, preferably use is made of an electrolyte containing ammonia ions or nitrate ions.

Comparative Examples

In Comparative Example 3-1, tungsten is added to the basic solution. The mechanical strength in the ordinary state is large, but the mechanical strength is remarkably lowered after heating at 300° C. for 1 hour. Further, when measuring the amount of tungsten in this copper foil, it is less than the lower limit of detection, i.e., 0.0001 wt %.

When containing chlorine ions in the electrolyte, precipitation of tungsten was suppressed and the electrolytic copper foil was formed, but an electrolytic copper alloy foil comprised of Cu—W alloy was not formed.

In Comparative Example 3-2, a copper foil was prepared based on PLT 4 (Japanese Patent No. 3238278). The film was formed by a composition obtained by further adding glue to the electrolyte of Comparative Example 3-1.

In this copper foil, the mechanical strength in the ordinary state is small and the mechanical strength remarkably falls after heating at 300° C. for 1 hour. When measuring the amount of tungsten in this copper foil, it was less than the lower limit of detection, i.e., 0.0001 wt %.

Glue was added to the electrolyte, but glue does not have [=S]. Therefore, it is believed that, due to the glue, an adsorbed layer of organic molecules could not be formed on the copper by adsorption with a higher priority than the chlorine ions, therefore the tungsten oxide was not adsorbed onto the copper, incorporation of tungsten into the foil did not occur, and an electrolytic Cu—W alloy foil was not formed.

Example D

In the present example, after preparing the electrolytic copper alloy foils, HDD suspension use substrates having a configuration of stainless steel foil, a polyimide resin layer, and an electrolytic copper alloy foil were prepared and were evaluated for characteristics.

Preparation of Electrolytic Copper Alloy Foils and Electrolytic Copper Foils

Example 4-1

As a sulfuric acid-copper sulfate electrolyte, the following bath was used as the basic bath composition.

Cu=50 to 150 g/liter $H_2SO_4$=20 to 200 g/liter

Thiourea=3 to 20 ppm

Sodium tungstate (as tungsten)=10 to 1,000 ppm

Chlorine ions=1 to 100 ppm

After electrodeposition under the following conditions by using this electrolyte and forming an untreated copper alloy foil, roughening treatment and surface treatment same as those for an electrolytic copper foil F2-WS made by Furukawa Electric Co., Ltd. were carried out to produce an electrolytic copper alloy foil having a thickness of 9 μm.

Current density=30 to 100 $A/dm^2$

Temperature=30 to 70° C.

Example 4-2

An electrolyte composition of the same conditions as those for Example 1 but only using the following thiourea compound was used.

Ethylene thiourea=1 to 20 ppm

After electrodeposition under the same conditions as those in Experiment 1 by using this electrolyte to form an untreated copper alloy foil, the same roughening treatment and surface treatment as those for electrolytic copper foil F2-WS made by Furukawa Electric Co., Ltd. were carried out to produce an electrolytic copper alloy foil having a thickness of 9 μm.

Example 4-3

An electrolyte composition of the same conditions as those for Example 1 but only using the following thiourea compound was used.

N,N-diethylthiourea=1 to 20 ppm

After electrodeposition under the same conditions as those in Experiment 1 by using this electrolyte to form an untreated copper alloy foil, the same roughening treatment and surface treatment as those for electrolytic copper foil F2-WS made by Furukawa Electric Co., Ltd. were carried out to produce an electrolytic copper alloy foil having a thickness of 9 μm.

Comparative Example 4-1

An electrolytic copper foil F2-WS made by Furukawa Electric Co., Ltd. having a thickness of 9 μm was prepared.

Comparative Example 4-2

An electrolytic copper foil HLA made by Nippon Denkai, Ltd. having a thickness of 9 μm was prepared.

Using the electrolytic copper alloy foils and electrolytic copper foils prepared in above examples and comparative examples, HDD suspension use substrates having configurations of stainless steel foil, a polyimide resin layer, and electrolytic copper alloy foil or electrolytic copper foil were prepared.

Synthesis of Polyimide Resin

Synthesis Example 1

In order to synthesize a polyimide resin having a low thermal expansion property with a linear expansion coefficient of 30 ppm/K or less, 9.0 mol of DADMB was weighed and was dissolved in 25.5 kg of a solvent DMAc while stirring it in a 40 liter planetary mixer. Then, 8.9 mol of BPDA was added and stirring was continued at room temperature for 3 hours to perform a polymerization reaction to thereby obtain a viscous solution of a polyimide precursor A. The thermal expansion coefficient after imidization of the polyimide precursor A according to the present Synthesis Example was 13 ppm/K.

Synthesis Example 2

In order to synthesize a polyimide resin having a glass transition temperature of 300° C. or less, 6.3 mol of DADMB was weighed and was dissolved in 25.5 kg of a solvent DMAc while stirring it in a 40 liter planetary mixer. Then, 6.4 mol of BPDA was added and stirring was continued at room temperature for 3 hours to perform a polymerization reaction to thereby obtain a viscous solution of a polyimide precursor B. The glass transition temperature by a dynamic viscoelastic property measurement device after imidization of the polyimide precursor B according to the present Synthesis Example was 225° C.

Note that, abbreviations used here are as follows.
DADMB: 4,4'-diamino-2,2'-dimethylbiphenyl
DMAc: N,N-dimethylacetamide
BPDA: 3,3',4,4'-biphenyl tetracarboxylic dianhydride
BAPP: 2,2'-bis[4-(4-aminophenoxy)phenyl]propane Preparation of HDD Suspension Use Substrate (a) A solution of the polyimide precursor B obtained in Synthesis Example 2 was coated on stainless steel foil (made by Nippon Steel & Sumitomo Metal Corporation, SUS304, tension annealed product, thickness: 20 μm) so that the thickness after hardening became 1 μm and was dried at 110° C. for 3 minutes. (b) After that, a solution of the polyimide precursor A obtained in Synthesis Example 1 was coated on that so that the thickness after hardening became 7.5 μm and (c) was dried at 110° C. for 10 minutes, and (d) a solution of the polyimide precursor B obtained in Synthesis Example 2 was further coated on that so that the thicknesses after hardening became 1.5 μm and (e) was dried at 110° C. for 3 minutes. (f) After that, the imidization was completed by further performing stepwise heat treatment in several stages within a range of 130 to 360° C. for 3 minutes for each to thereby obtain a laminate of a polyimide resin layer having a thickness of 10 μm on stainless steel. Note that, the polyimide resin layer of the first layer and the polyimide resin layer of the third layer were made the same.

Next, the electrolytic copper alloy foils or electrolytic copper foils shown in the examples and comparative examples were superimposed on each other and were hot pressed using a vacuum press machine under conditions of surface pressure of 15 Mpa, a temperature of 320° C., and a pressing time of 20 minutes to obtain the targeted laminates.

Measurement of Peel Strength

For the adhesive strength of the metal foil and polyimide resin, a polyimide resin layer was formed on stainless steel foil, then electrolytic copper alloy foil or electrolytic copper foil was further hot-pressed to prepare a laminate having metallic foils on the two surfaces. This was worked to a predetermined shape to thereby prepare a measurement use sample having a line width of ⅛ inch. This sample was adhered to a fixed plate at the SUS foil side and copper alloy foil or copper foil side, then a tensile tester was used to measure the peel strength in a direction of 90 degrees for each metallic foil.

Measurement of Warp

The laminate was worked to prepare a disc having a diameter of 65 mm. This was allowed to stand at 23° C. and a humidity of 50% for 24 hours, then the location with the greatest warping when placed on a desk was measured by a vernier micrometer.

Measurement of linear thermal expansion coefficient

For measurement of the linear thermal expansion coefficient, a thermomechanical analyzer (Seiko Instruments Inc.) was used. The sample was raised in temperature up to 255° C. at a rate of 20° C./min, was held at that temperature for 10 minutes, then was further cooled at a constant rate of 5° C./min. A mean thermal expansion coefficient (linear thermal expansion coefficient) from 240° C. to 100° C. at the time of cooling was calculated.

The results are shown in Table 7. HDD suspension use substrates having the configuration of stainless steel foil, polyimide resin layer, and electrolytic copper alloy foil using electrolytic copper alloy foils shown in Examples 4-1 to 4-3 sufficiently satisfy the required characteristics as the suspension substrate materials.

TABLE 7

|  |  | Example | | | Comparative Example | |
| --- | --- | --- | --- | --- | --- | --- |
|  |  | 4-1 | 4-2 | 4-3 | 4-1 | 4-2 |
| Thickness | μm | 9 | 9 | 9 | 9 | 9 |
| W content in alloy foil | wt % | 0.009 | 0.010 | 0.012 | — | — |
| Strength at ordinary temperature | MPa | 655 | 771 | 787 | 320 | 510 |
| Strength after heating | MPa | 461 | 510 | 550 | 225 | 208 |
| Elongation at ordinary temperature | % | 2.8 | 3.5 | 3.3 | 8.5 | 6.0 |
| Elongation after heating | % | 4.0 | 4.3 | 4.9 | 11.8 | 16.0 |
| Conductivity | % | 90 | 88 | 85 | 98 | 98 |
| Polyimide thermal expansion coefficient | ppm/K | 22.3 | 22.3 | 22.3 | 22.3 | 22.3 |
| Stainless steel-polyimide peel strength | kN/m | 1.5 | 1.5 | 1.5 | 1.5 | 1.5 |
| Copper foil-polyimide peel strength | kN/m | 1.4 | 1.4 | 1.4 | 1.4 | 1.1 |
| Warping | mm | 2.8 | 2.5 | 2.3 | 21.5 | 23.5 |

As explained above, according to the present invention, there can be provided an electrolytic copper alloy foil having a large mechanical strength in an ordinary state and resistant to heat deterioration even when it is heated at 300° C. or more.

Further, according to the present invention, there can be provided an electrolytic copper alloy foil excellent as a current collector for a lithium ion secondary cell and there can be provided an excellent secondary cell by using the current collector.

INDUSTRIAL APPLICABILITY

An electrolytic copper alloy foil of the present invention is preferred as a printed circuit board material from which a large mechanical strength is demanded even after heating, for example, an HDD suspension material or component material in the field of a TAB material.

Further, it can be preferably used not only as the material of a printed circuit board, but also as a component material in the field in which large mechanical strength and conductivity are demanded even after heating at a high temperature.

The invention claimed is:

1. An electrolytic copper alloy foil comprising from 0.0001 to 0.060 wt % of tungsten,
   wherein the tungsten is at least partially incorporated as an oxide.

2. An electrolytic copper alloy foil, comprising from 0.001 to 0.055 wt % of tungsten,
   wherein the electrolytic copper alloy foil has a tensile strength at ordinary temperature of 650 MPa or more and a tensile strength after treatment at 300° C. for 1 hour of 450 MPa or more.

3. An electrolytic copper alloy foil, comprising from 0.001 to 0.055 wt % of tungsten,
   wherein the electrolytic copper alloy foil has a tensile strength at ordinary temperature of 650 MPa or more and a tensile strength after treatment at 300° C. for 1 hour of 450 MPa or more, and
   wherein the electrolytic copper alloy foil has an elongation at ordinary temperature of 2.5% or more, and an elongation after treatment at 300° C. for 1 hour of 3.5% or more.

4. An electrolytic copper alloy foil, comprising:
   from 0.0001 to 0.060 wt % of tungsten; and
   chlorine.

5. An electrolytic copper alloy foil, comprising:
   from 0.0001 to 0.060 wt % of tungsten; and
   from 0.005 to 0.040 wt % of chlorine.

6. An electrolytic copper alloy foil comprising from 0.0001 to 0.060 wt % of tungsten,
   wherein the electrolytic copper alloy foil has a peak intensity ratio I<220>/I<200> obtained by X-ray diffraction between a peak intensity I<220> of a crystal orientation I<220> and a peak intensity I<200> of a crystal orientation I<200> of 1.2 or more.

7. An electrode, comprising an electrolytic copper alloy foil comprising from 0.0001 to 0.060 wt % of tungsten as a negative electrode current collector, wherein the electrode is suitable for a lithium ion secondary cell, and wherein the electrolytic copper alloy foil deposits silicon, germanium, tin, an alloyed compound thereof, an active material comprising silicon, germanium, tin, or an alloyed compound thereof as a principal ingredient on the surface of the electrolytic copper alloy foil.

8. A method for producing the electrolytic copper alloy foil of claim 2, the method comprising:
   adding from 10 to 1,000 ppm of tungsten, from 1 to 20 ppm of at thiourea compound, and from 1 to 100 ppm of an chlorine ion as an additive to a copper sulfate electrolyte, thereby forming the electrolytic copper foil,
   wherein the electrolytic copper alloy foil comprises from 0.001 to 0.055 wt % of tungsten, and
   wherein the electrolytic copper alloy foil has a tensile strength at ordinary temperature of 650 MPa or more, a tensile strength after treatment at 300° C. for 1 hour of 450 MPa or more, and a conductivity of 80% or more.

* * * * *